United States Patent [19]

Komada et al.

[11] Patent Number: 4,772,509
[45] Date of Patent: Sep. 20, 1988

[54] PRINTED CIRCUIT BOARD BASE MATERIAL

[75] Inventors: Ichiro Komada, Okayama; Minoru Hatakeyama, Sakuragaokanishi, both of Japan

[73] Assignee: Japan Gore-Tex, Inc., Tokyo, Japan

[21] Appl. No.: 37,713

[22] Filed: Apr. 13, 1987

[51] Int. Cl.⁴ .................. B32B 17/10; B32B 27/10
[52] U.S. Cl. .................... 428/251; 428/422; 428/473.5; 428/901
[58] Field of Search .............. 428/901, 422, 473.5, 428/251; 427/96

[56] References Cited

U.S. PATENT DOCUMENTS

| | | | |
|---|---|---|---|
| 3,953,566 | 4/1976 | Gore | 428/422 X |
| 3,962,153 | 6/1976 | Gore | 428/422 X |
| 3,968,297 | 7/1976 | Sauer | 428/422 X |
| 4,680,220 | 7/1987 | Johnson | 428/901 X |

*Primary Examiner*—Thomas J. Herbert
*Attorney, Agent, or Firm*—Mortenson & Uebler

[57] ABSTRACT

A printed circuit board base prepreg material is provided of a porous, expanded polytetrafluoroethylene (PTFE) membrane or fabric impregnated with a polyimide resin varnish. Upon curing, a printed circuit board base material of porous, expanded PTFE impregnated with polyimide resin is provided. The base material of the invention may be laminated to a glass fabric to improve strength and dimensional stability.

4 Claims, 1 Drawing Sheet

PRINTED CIRCUIT BOARD BASE MATERIAL

BACKGROUND OF THE INVENTION

This invention relates to a printed circuit board base material which has a low dielectric constant, possesses desirable strength properties and transmits electric signals at high speeds.

For the purpose of permitting production of printed circuits of high operating speed which are suitable for the recently developed super-highspeed elements such as gallium arsenide IC's, development of a material having a low dielectric constant for printed circuit boards is indispensable to preclude delay in propagation time. Several efforts have been devoted to date to the development of such materials.

As such materials, polyimide resin and polyester resin have been used for impartation of flexibility. For materials requiring rigidity, molded articles of epoxy resin, phenolic resin, and polyimide resin reinforced with glass fibers, fabric, or paper have been used.

The conventional printed circuit boards such as the polyimide resin and the polyester resin mentioned above, glass/epoxy board, and paper-phenol board have dielectric constants not lower than 3.5 (at 1 MHz) and generally falling on the order of 4.0 to 5.0. Thus, they are not capable of meeting the aforementioned requirement that devices of high operating speed should be developed so as to permit full utilization of the recently developed ultra-high-speed elements.

SUMMARY OF THE INVENTION

A printed circuit board base prepreg material is provided comprising a substrate of porous, expanded PTFE impregnated with a polyimide varnish. The substrate may be a membrane of porous, expanded PTFE or a fabric woven from fibers of porous, expanded PTFE. In the final product, the polyimide is cured. The prepreg material and the cured board may be laminated to a glass fabric.

DETAILED DESCRIPTION OF THE INVENTION AND PREFERRED EMBODIMENTS WITH REFERENCE TO THE DRAWINGS

A printed circuit board base prepreg material is provided of a porous, expanded polytetrafluoroethylene (PTFE) membrane of fabric impregnated with a polyimide resin varnish. Upon curing, a printed circuit board base material of porous, expanded PTFE impregnated with polyimide resin is provided. The base material of the invention may be laminated to a glass fabric to improve strength and dimensional stability.

The polytetrafluoroethylene resin has a very low dielectric constant of approximately 2.1 and possesses thermal stability such that it will not be deteriorated up to a continuous working temperature of 260° C. Polyimide resin has a relatively low dielectric constant and possesses high thermal stability. By using the aforementioned polytetrafluoroethylene resin in the form of expanded, porous PTFE, and the aforementioned polyimide resin in the form of varnish, they are effectively combined to form an integral composite which also has a low dielectric constant.

The aforementioned porous, expanded polytetrafluoroethylene material is obtained by the known techniques of extruding, rolling and stretching, as set forth in U.S. Pat. No. 3,953,566. It may be produced in the form of a film or a yarn. In either of these two forms, the porous material can be suitably utilized. Fragments of this porous material may be used partially or wholly.

The porous material impregnated with the polyimide varnish is heated, when necessary under application of pressure, to cure the polyimide and complete a printed circuit board base material.

EXAMPLE

A working example of the invention constructed as indicated above will be described with reference to the accompanying drawings. A porous polytetrafluoroethylene material 1 having minute fibers 12 similar in appearance to the pattern of a spider web and having minute nodes 11 as illustrated in FIG. 1 is impregnated with polyimide resin 2 and the resultant composite is left standing to allow the polyimide resin 2 to be cured as deposited in the pores of the porous material 1.

Figure 2:
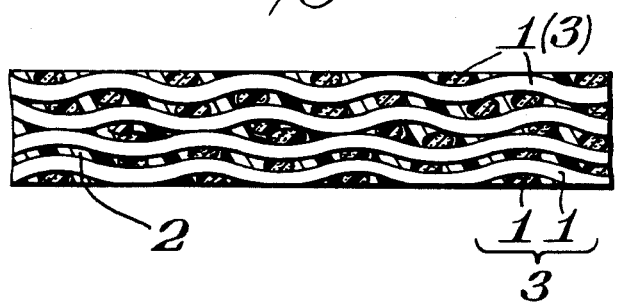
FIG. 2 is a schematic cross-sectional view of an alternate embodiment of a printed circuit board base material of the invention.

FIG. 2 illustrates a composite obtained by superposing a plurality of woven fabrics 3 made of yarns 1 of polytetrafluoroethylene and impregnating the mass of superposed fabrics with polyimide resin 2.

Figure 1:
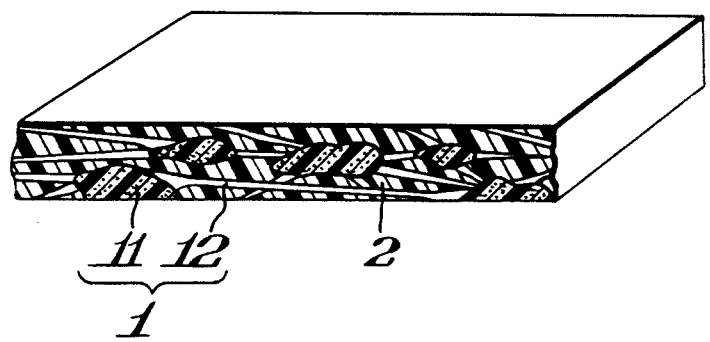
FIG. 1 is a schematic cross-sectional view of a printed circuit board base material of the invention.
Figure 3:
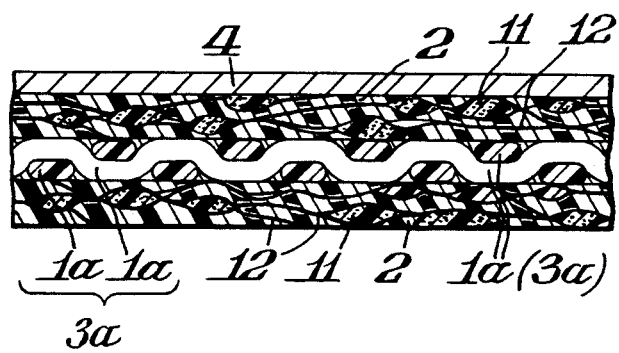
FIG. 3 is a schematic cross-section of a printed circuit board using the base material according to the invention.

FIG. 3 illustrates a composite which is obtained by interposing a glass fabric 3a between two porous films of the construction shown in FIG. 1, impregnating the resultant superposed layers collectively with the polyimide resin 2, and joining a copper foil 4 thereto by adhesion. The adhesion of the copper foil 4 is effected either by the use of a separate adhesive agent or by causing the copper foil 4 to be superposed on the layers at the time that the polyimide resin is cured. For the purpose of equalizing the thermal expansion coefficient of the base board and that of the copper foil, the glass cloth is additionally incorporated in the composite.

The materials obtained as described above according to the present invention have dielectric constants not exceeding 3.5, preferably not exceeding 2.5 and, therefore, can be used advantageously as base boards utilizing the super-high-speed elements discussed previously.

Typical productions embodying this invention will now be cited.

PRODUCTION EXAMPLE 1

A composite constructed as shown in FIG. 1 was obtained by impregnating a porous membrane of polytetrafluoroethylene having a porosity of 80% and a thickness of 0.08 mm with polyimide varnish. The composite was left standing in a constant temperature bath at 100° C. for 5 minutes to remove the solvent component of the varnish, to produce a prepreg. This prepreg was then cured by hot pressing.

PRODUCTION EXAMPLE 2

A woven fabric of polytetrafluoroethylene yarns having a basis weight of 300 g/m$^2$ was impregnated with polyimide varnish. The wet woven fabric was left standing in a constant temperature bath at 100° C. for 5 minutes to dry the solvent component of the varnish to prepare a prepreg. Four such prepregs were superposed one on another and laminated together and cured by hot pressing.

PRODUCTION EXAMPLE 3

A porous membrane of polytetrafluoroethylene having a porosity of 75% and a thickness of 0.03 mm was impregnated with polyimide varnish and left standing in a constant temperature bath at 100° C. for 5 minutes to dry the solvent and obtain a prepreg. A glass fabric having a basis weight of 25 g/m$^2$ was interposed between two such prepregs and a copper foil 18 micrometers in thickness was disposed on the outer side of one of the prepregs. The layers thus obtained were cured and laminated together by hot pressing to complete a product.

The products obtained in Production Examples 1-3 were tested for dielectric constant and insulation properties. The results were as shown below.

|  | Dielectric constant | Dielectric loss tangent | Volume resistivity |
| --- | --- | --- | --- |
| Production 1 | 2.3 | 0.003 | 10$^{16}$ Ohm-cm |
| Production 2 | 2.4 | 0.003 | 10$^{16}$ Ohm-cm |
| Production 3 | 2.5 | 0.003 | 10$^{16}$ Ohm-cm |

The products had dielectric constants invariably of not more than 2.5, values notably small as compared to those of conventional products. The products possessed outstanding properties for printed circuit boards utilizing the recently developed high speed elements mentioned above.

As described above, this invention provides printed circuit boards which possess outstanding properties such as very low dielectric constants of not more than 2.5 and permits production of printed circuits of high operating speed utilizing the recently developed super high speed elements. Thus, this invention enjoys a high economic value.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims hereinbelow.

What is claimed is:

1. A printed circuit board base prepreg material comprising a membrane of a porous, expanded PTFE impregnated with a polyimide varnish.

2. The material of claim 1 laminated to a glass fabric.

3. The material of claim 1 wherein said polyimide is cured.

4. The material of claim 3 laminated to a glass fabric.

* * * * *